United States Patent
Lee et al.

(10) Patent No.: US 11,569,804 B1
(45) Date of Patent: Jan. 31, 2023

(54) INL DETECTION AND CALIBRATION FOR PHASE-INTERPOLATOR

(71) Applicant: Avago Technologies International Sales Pte. Limited, Singapore (SG)

(72) Inventors: Seong-Ho Lee, Aliso Viejo, CA (US); SangHye Chung, Irvine, CA (US); Hyung-Joon Jeon, Irvine, CA (US); Vadim Milirud, Lake Forest, CA (US); Wei Zhang, Irvine, CA (US); Angus Tang, Mission Viejo, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 17/727,110

(22) Filed: Apr. 22, 2022

(51) Int. Cl.
  *H03K 5/13* (2014.01)
  *H03K 5/01* (2006.01)
  *H03K 5/00* (2006.01)

(52) U.S. Cl.
  CPC ..... *H03K 5/01* (2013.01); *H03K 2005/00058* (2013.01)

(58) Field of Classification Search
  CPC .................. H03K 5/01; H03K 2005/00058
  USPC ......................................................... 327/231
  See application file for complete search history.

(56) References Cited

U.S. PATENT DOCUMENTS

| | | | | |
|---|---|---|---|---|
| 6,573,771 B2* | 6/2003 | Lee | ........................ | H03L 7/0816 327/158 |
| 6,768,361 B2* | 7/2004 | Kwak | ........................ | H03L 7/0816 327/158 |
| 6,982,578 B2* | 1/2006 | Lee | ........................ | H03L 7/0814 327/236 |
| 8,373,475 B2* | 2/2013 | Na | ........................ | H03L 7/0818 327/158 |
| 8,415,996 B1* | 4/2013 | Wong | ........................ | H04L 7/0337 327/237 |
| 8,634,509 B2* | 1/2014 | Crain | ........................ | H04L 7/033 375/355 |
| 8,901,981 B2* | 12/2014 | Park | ........................ | H03K 5/131 327/276 |
| 9,362,936 B1* | 6/2016 | Caffee | ........................ | H03K 5/135 |
| 9,485,082 B1* | 11/2016 | Sun | ........................ | H03L 7/0807 |
| 9,705,515 B1* | 7/2017 | Lee | ........................ | H03L 7/093 |
| 11,456,851 B2* | 9/2022 | Kim | ........................ | H03L 7/093 |
| 2004/0217789 A1* | 11/2004 | Kwak | ........................ | H03L 7/087 327/158 |
| 2008/0063124 A1* | 3/2008 | Song | ........................ | H03L 7/091 375/355 |
| 2009/0163166 A1* | 6/2009 | Lin | ........................ | H03L 7/0998 455/260 |

(Continued)

*Primary Examiner* — Ryan Jager
(74) *Attorney, Agent, or Firm* — Adsero IP

(57) ABSTRACT

An apparatus includes control logic coupled to a phase detector circuit and an adjustable delay circuit. The control logic is configured to obtain a state of a first phase of an output signal of a phase interpolator relative to a second phase of a reference signal, and adjust a delay of the reference signal until the second phase matches the first phase. The control logic is further configured to measure a total delay of the reference signal when the second phase matches the first phase, and determine integral non-linearity of the phase interpolator at the first code based on the total delay. The control logic may further calibrate a first code of a phase interpolator based, at least in part, on the integral non-linearity.

20 Claims, 6 Drawing Sheets

(56) References Cited

U.S. PATENT DOCUMENTS

2011/0001527 A1* 1/2011 Lee ..................... H03L 7/0816
  327/158
2014/0139266 A1* 5/2014 Kenney ................ H03L 7/07
  327/156

* cited by examiner

INL DETECTION AND CALIBRATION FOR PHASE-INTERPOLATOR

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and apparatuses for addressing errors introduced by non-linearity in phase interpolators.

BACKGROUND

A phase interpolator (PI), also commonly referred to as a "phase rotator," is a core component that enables essential transceiver functions, such as clock and data recovery (CDR), loop timing mode, and spread spectrum clocking (SSC). Transceiver performance suffers from integral non-linearity (INL) in the PI, which introduces jitter to the recovered clock.

Jitter is important in systems with advanced modulation such as pulse amplitude modulation 4-level (PAM4) and quadrature amplitude modulation 16-level (QAM16)/quadrature amplitude modulation 64-level (QAM64), which are the dominant modulation schemes for links with speeds of 100 Gigabit and above. The timing and noise margin of a modulated signal are significantly smaller than for a non-return-to-zero (NRZ) signal. For analog-to-digital converter (ADC) based receivers with advanced modulation, inaccurate sampling clock timing degrades ADC performance. The degradation effects become greater with high speed input signals.

Thus, methods, systems, and apparatuses for INL detection and calibration are provided.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without identifying an existing sub-label, it is intended to refer to all such multiple similar components.

DETAILED DESCRIPTION OF EMBODIMENTS

Figure 1:
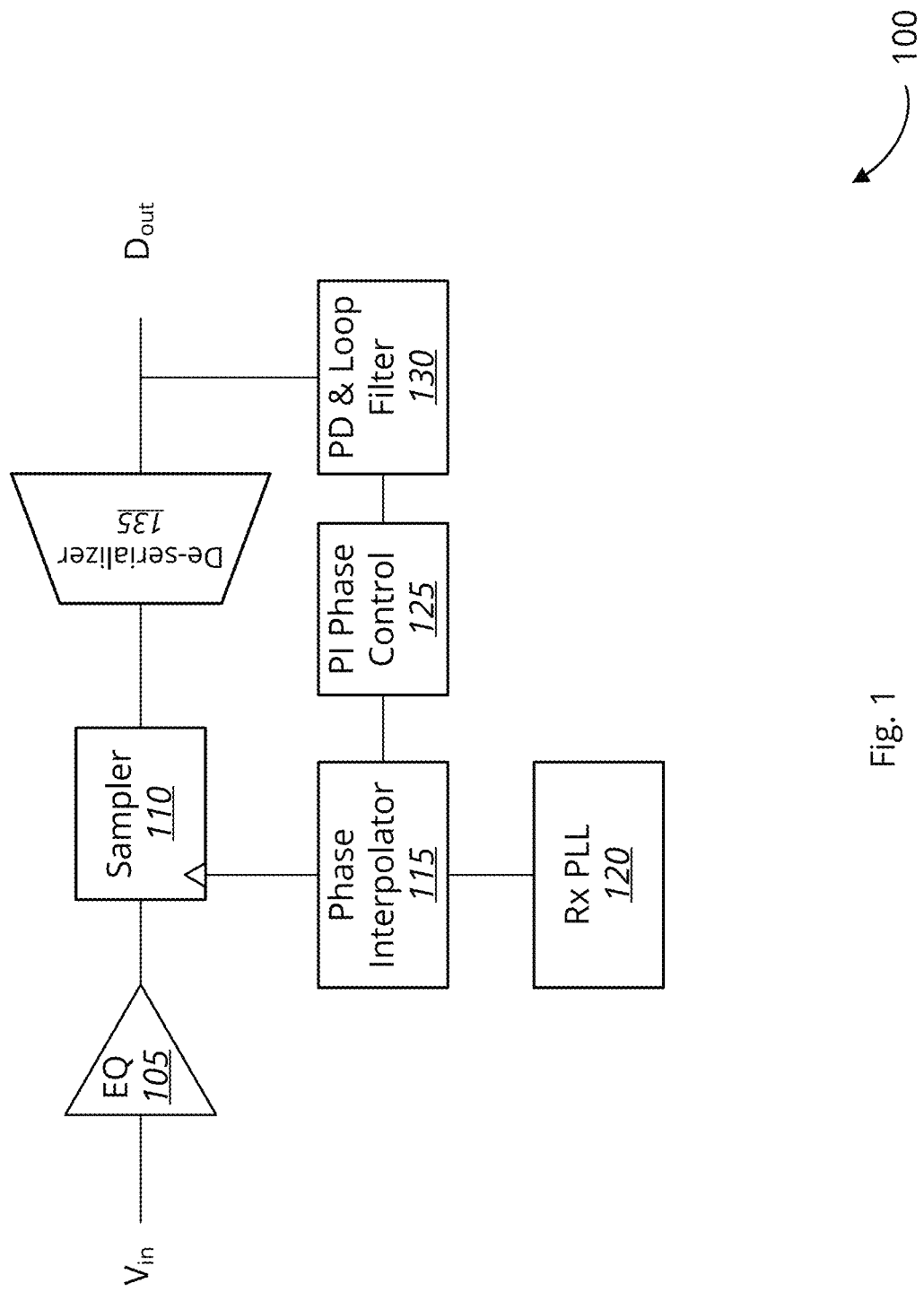
FIG. 1 is a schematic block diagram of a receiver system, in accordance with various embodiments.

Various embodiments provide tools and techniques for INL detection and calibration in phase-interpolators.

In some embodiments, a method for INL detection and calibration in phase-interpolators is provided. The method may include determining a first phase of an output signal of a phase interpolator, wherein the output signal is generated by the phase interpolator based on a first code, and adjusting, via an adjustable delay circuit, a delay of a reference signal having a second phase until the second phase matches the first phase, wherein the delay of the reference signal is adjustable in increments of steps. The method further includes measuring, via control logic, the delay of the reference signal when the second phase matches the first phase, wherein the delay is measured in steps, determining integral non-linearity of the phase interpolator at the first code based, at least in part, on the delay, and calibrating, via the control logic, the first code based, at least in part, on the integral non-linearity.

In some embodiments, a circuit for INL detection and calibration in phase-interpolators is provided. The circuit may include a phase detector circuit configured to determine a first phase of an output signal of a phase interpolator, wherein the output signal is generated by the phase interpolator based on a first code, determine a second phase of a reference signal, and determine a state of the first phase relative to the second phase, wherein the state indicates whether the first phase is ahead of or behind the second phase. The circuit may further include an adjustable delay circuit coupled to the phase detector circuit, the adjustable delay circuit configured to adjust a delay of the reference signal until the second phase matches the first phase, wherein the delay of the reference signal is adjustable in increments of steps. The circuit may further include control logic coupled to the phase detector circuit and the adjustable delay circuit. The control logic may be configured to measure a total delay of the reference signal when the second phase matches the first phase, wherein the total delay is measured in steps, determine integral non-linearity of the phase interpolator at the first code based on the total delay, and calibrate the first code based, at least in part, on the integral non-linearity.

In further embodiments, an apparatus for INL detection and calibration in phase-interpolators is provided. The apparatus may include control logic coupled to a phase detector circuit and an adjustable delay circuit. The control logic may be configured to obtain, via the phase detector circuit, a state of a first phase of an output signal of a phase interpolator relative to a second phase of a reference signal, wherein the state indicates whether the first phase is ahead of or behind the second phase, wherein the output signal is generated by a phase interpolator based on a first code, adjust, via the adjustable delay circuit, a delay of the reference signal until the second phase matches the first phase, wherein the delay of the reference signal is adjustable in increments of steps, and measure a total delay of the reference signal when the second phase matches the first phase, wherein the total delay is measured in steps. The control logic may further be configured to determine integral non-linearity of the phase interpolator at the first code based on the total delay, and calibrate the first code based, at least in part, on the integral non-linearity.

In the following description, for the purposes of explanation, numerous details are set forth to provide a thorough understanding of the described embodiments. It will be apparent to one skilled in the art, however, that other embodiments may be practiced without some of these details. In other instances, structures and devices are shown in block diagram form without full detail for the sake of clarity. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Similarly, when an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Conventional approaches have typically focused on improving the PI itself and preceding circuits. For example, to mitigate INL, conventional approaches attempt to adjust transistor size and input amplitude combinations to linearize a phase-to-input control relationship. However, conventional approaches are unable to achieve good linearity over different process, voltage, and temperature (PVT) conditions. These approaches often lead to excessive power consumption and/or area overhead, resulting in a large transistor size or large input amplitude. Another conventional approach attempts to shape a PI current biasing digital-to-analog converter (DAC) with a non-uniform weighting to equalize the non-linear phase-to-PI code relationship. Similarly, this process cannot be applied over different PVT conditions, as PI non-linearity shape (e.g., the shape of a PI non-linearity profile, which plots INL over PI code) varies with PVT. The PI non-linearity shape can also change with input signal amplitude variations, and rise/fall time, which cannot be compensated by non-uniform weighting of the PI current biasing DAC. Moreover, shaping of the PI current biasing DAC (e.g., current DAC) can result in large amplitude variation over PI code (e.g., the amplitude of the PI output varies depending on PI code).

The embodiments set forth below may allow for a more robust, scalable approach to mitigating INL. Specifically, the embodiments below describe techniques for detecting INL of a particular PI, and calibrating to remove the detected INL of the PI. For example, non-idealities, originating from an input clock to the PI (e.g., multiphase skew error, duty cycle distortion, signal amplitude and shape), are canceled. This may reduce power consumption and size of preceding circuits providing clocks to PI inputs.

FIG. 1 is a schematic block diagram of receiver system 100, in accordance with various embodiments. The system 100 includes an equalizer 105, sampler 110, phase interpolator 115, receiver (Rx) phase-locked loop (PLL) 120, PI phase control 125, phase detector and loop filter 130, and de-serializer 135. It should be noted that the various components of the system 100 are schematically illustrated in FIG. 1, and that modifications to the various components and other arrangements of system 100 may be possible and in accordance with the various embodiments.

In various embodiments, the system 100 may be configured to receive an input signal, $V_{in}$, to be converted to a digital output signal $D_{out}$. In various examples, $V_{in}$ is an analog signal received by the receiver system 100. In some examples, equalizer 105 may be configured to equalize the input signal, $V_{in}$. In some examples, equalizer 105 includes a linear equalizer, such as a continuous time linear equalizer (CTLE) while in further embodiments, equalizer 105 includes a non-linear equalizer, such as a decision feedback equalizer (DFE), or a combination of CTLE and/or DFE. In some examples, equalizer 105 includes one or more equalizers in a multistage arrangement. Equalizer 105 may include, without limitation, a digital equalizer and/or a hybrid equalizer. Equalizer 105 may further include an adjustable amplifier with automatic gain control (AGC). According to some examples, equalizer 105 may be configured to equalize the input signal, $V_{in}$, to account for channel characteristics (e.g., channel loss) and noise.

The equalized signal, from equalizer 105, may be provided to sampler 110. In some examples, sampler 110 may include an ADC and/or one or more slicers. According to various embodiments, sampler 110 may be configured to sample the equalized input signal, $V_{in}$. In some examples, the input signal may be a demodulated signal, of which sampler 110 sequentially outputs sample signals to the de-serializer 135. In various embodiments, sampler 110 may be clocked by a clock signal generated by the PI 115. Sampler 110 may sample serial data of the input signal, equalized by equalizer 105, and synchronized with the clock signals output by PI 115. Thus, de-serializer 135 may convert the serial samples of the sampler 110 into multiple parallel samples to be passed to downstream digital blocks as the respective bits of the output digital signal $D_{out}$. In one example, the de-serializer 135 may include a de-multiplexer circuit.

In some examples, to generate the clock signals, PI 115 receives, from Rx PLL 120, a set of quadrature clock signals (e.g., in-phase clock signals (FIB) and quadrature clock signals (Q/QB)). In various examples, each of the clock signals may be phase-shifted from a reference clock signal, where the four clock signals I, IB, Q, and QB are evenly spaced. In some examples, I and Q may be separated in phase by 90 degrees, D3 phase shifted 90 degrees from Q, and QB phase shifted 90 degrees from IB. Although the clock signals are described herein as being four-phase quadrature clock signals with respect to various examples for explanatory purposes, it is to be understood that the clock signals are not limited to four-phase quadrature clock signals, and that in other embodiments, a different number of clock signals may be used. Thus, the clock signals may, in various examples, include multi-phase clock signals (e.g., four-phase, eight-phase) with an m-number of phases, where m is an integer. In some examples, the multi-phase clock signals may be provided by the PLL, such as Rx PLL 120. A PLL, such as Rx PLL 120 (and Tx PLL 220 below) is a circuit configured to generate clock signals, with feedback mechanisms to accurately track the frequency of an input signal. In other examples, the PI 115 may be configured to generate the multi-phase clock signals from a reference clock signal directly, as opposed to receiving the multi-phase clock signals from a PLL.

In some examples, PI 115 may generate complementary recovered clock signals CK and CKb, which may be a sample clock signal for sampler 110. In various examples, PI 115 may adjust or interpolate the phases of the clock signals from the Rx PLL 120, based on a phase control signal generated by PI phase control 125. Thus, the recovered clock signals may be clock signals generated by the PI 115, based on phase errors extracted from the output digital signal. Accordingly, in some examples, PI phase control 125 may further be coupled to a phase detector (PD) and loop filter 130 circuit. The PD and loop filter 130 may be configured to filter phase error information extracted from the output digital signal $D_{out}$ and track the phase of input signal. Thus, PI phase control 125 may receive phase error information extracted from the output digital signal from PD and loop filter 130.

Thus, while PI phase control 125 may mitigate some timing error through, for example, a clock-data-recovery (CDR) loop, it may not address the non-linearity of PI 115. Accordingly, a PI 115 implementing an INL detection and calibration architecture is set forth and described in further detail below with respect to FIG. 3.

Figure 2:
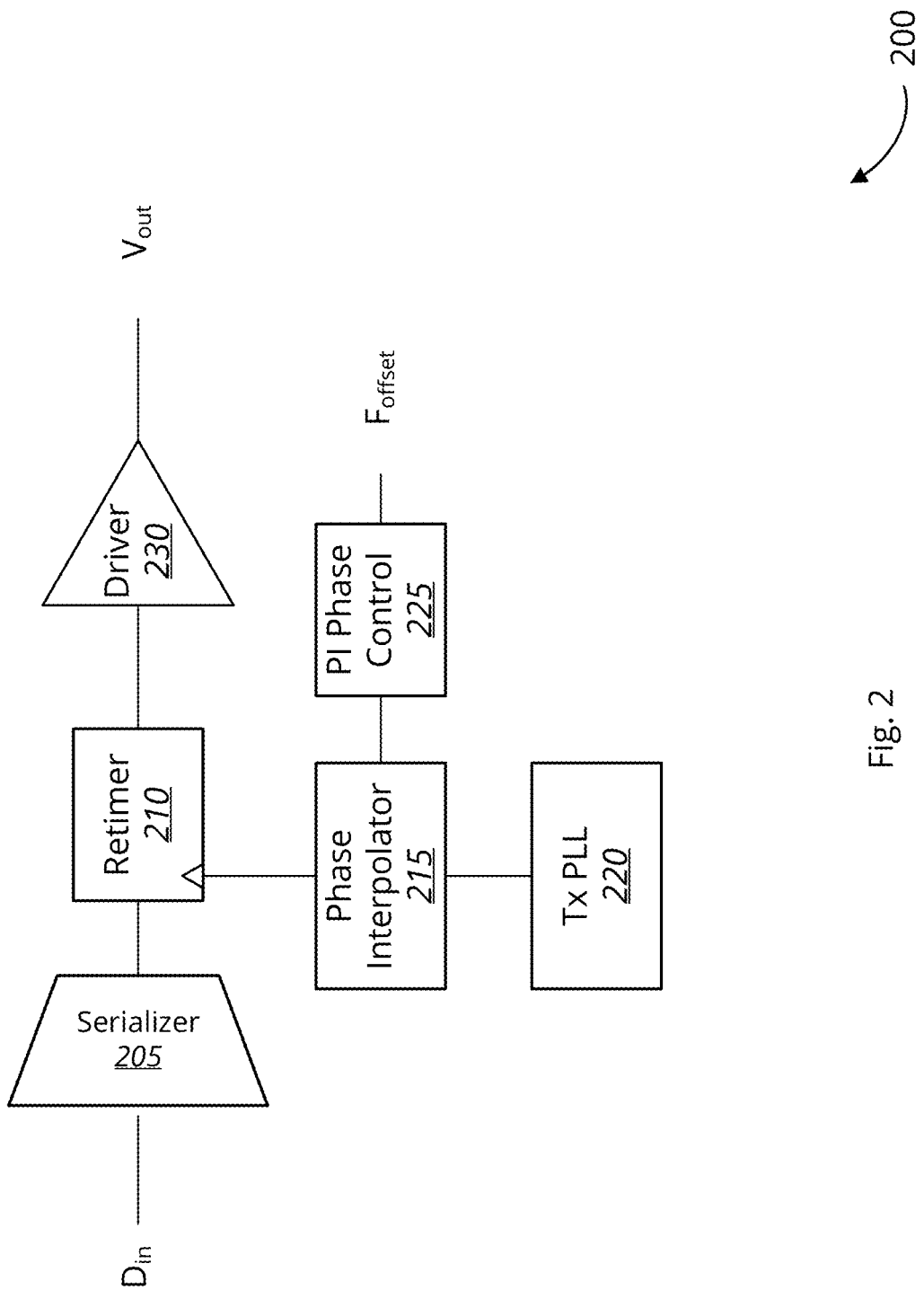
FIG. 2 is a schematic block diagram of a transmitter system, in accordance with various embodiments.

FIG. 2 is a schematic block diagram of a transmitter system 200, in accordance with various embodiments. The system 200 includes a serializer 205, retimer 210, PI 215, Tx PLL 220, PI phase control 225, and driver 230. It should be noted that the various components of the system 200 are schematically illustrated in FIG. 2, and that modifications to the various components and other arrangements of system 200 may be possible and in accordance with the various embodiments.

In various embodiments, the system 200 may be configured to receive a digital input signal, $D_{in}$, to be converted to an analog output signal $V_{out}$. The serializer 205 may be configured to convert the multiple parallel bits of the digital input signal, $D_{in}$, into a serial stream of the respective bits. In one example, serializer 205 may include a multiplexer circuit. The retimer 210 may be configured to recover the data from the serializer 205, extract the embedded clock from the digital input signal, and re-transmit the data with a clock signal provided by PI 215. Thus, the retimer 210 may be configured to synchronize the outputs from the serializer to the correct clock phase.

The driver 230 receives the output of the retimer 210, converts the data stream into an analog signal, and drives the analog signal into the appropriate channel. In various examples, the driver 230 may be implemented as voltage mode driver circuitry, current mode driver circuitry, or a DAC. In some examples, serializers 205 and retimers 210 may be merged as a single circuit element. Similarly, in some examples, retimers 210 and drivers 230 may also be merged as a single circuit element. The Tx PLL 220 includes circuitry for providing a low noise clock signal for the retimer 210.

In various examples, the transmitter system 200 may transmit the data at a slightly different rate than the clock signal from Tx PLL 220 frequency. Thus, the transmitter system 200 may employ a PI 215 to introduce a frequency offset from the Tx PLL 220. In various examples, PI codes may be generated (or controlled) via the PI phase control circuit 225. Accordingly, the PI phase control circuit 225 may be configured to generate the PI code according to a given frequency offset ($F_{offset}$). The phase of the PI output clock signal may be shifted and/or rotated by the PI phase control circuit 225 to introduce the desired frequency offset to the Tx PLL 220 clock signal.

In the transmitter system 200, PI non-linearity may lead to jitter, which may degrade retimer 210 performance and distort driver 230 output. Accordingly, a PI 215 implementing an INL detection and calibration architecture is set forth and described in further detail below with respect to FIG. 3.

Figure 3:
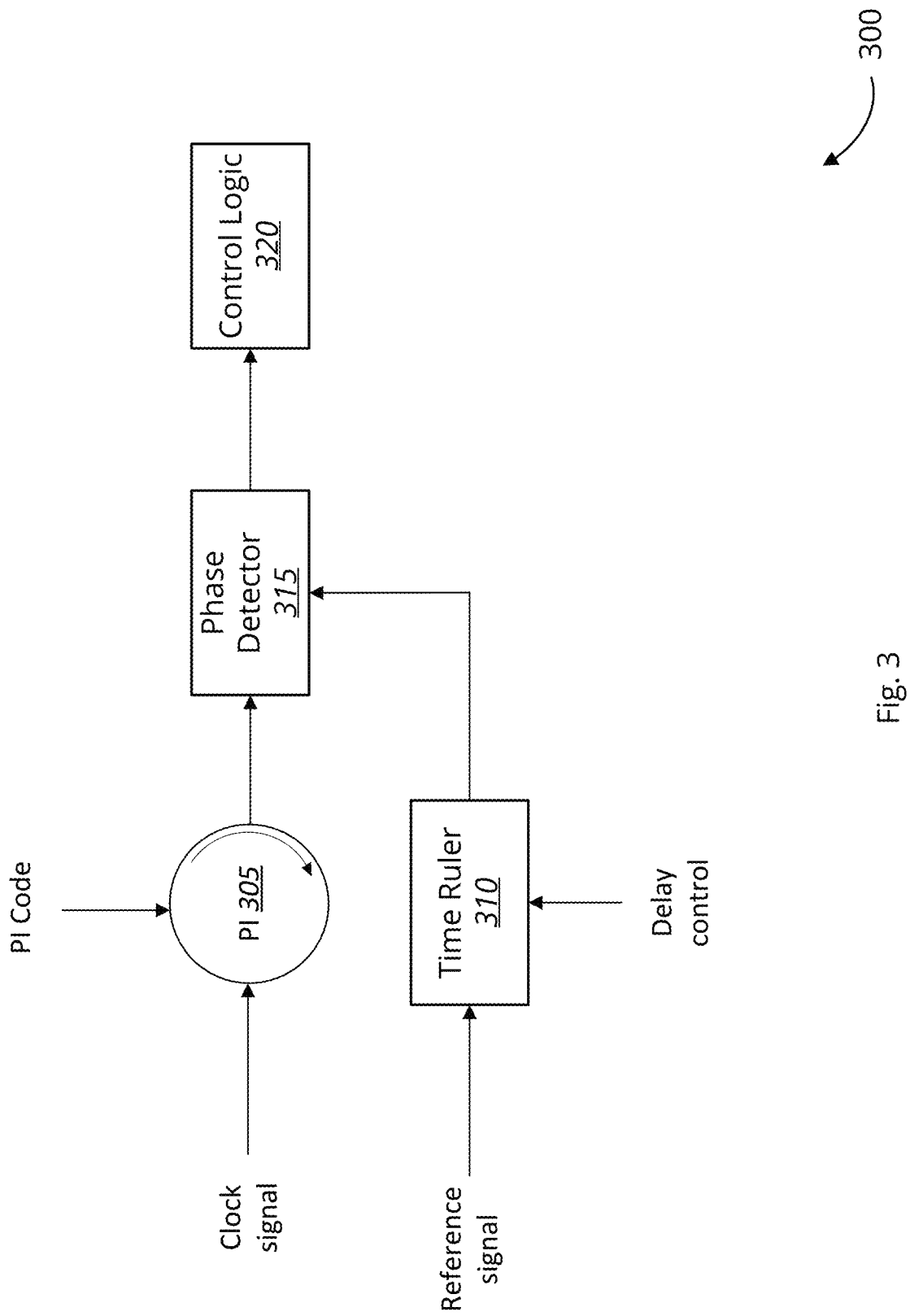
FIG. 3 is a schematic block diagram of an INL detection circuit, in accordance with various embodiments.

FIG. 3 is a schematic block diagram of an INL detection circuit 300, in accordance with various embodiments. The INL detection circuit 300 includes a PI 305, time ruler circuit 310, phase detector 315, and control logic 320. It should be noted that the various components of the circuit 300 are schematically illustrated in FIG. 3, and that modifications to the various components and other arrangements of circuit 300 may be possible and in accordance with the various embodiments.

According to various embodiments, the PI 305 may be configured to rotate an input signal (e.g., a clock signal) based on a PI code. Specifically, the PI 305 may rotate an input signal from 0 to 360 degrees (e.g., a phase shift of 0 to 360 degrees) based on the PI code. For purposes of explanation, in one example, a PI code may be a 2-bit value, including PI codes 1 (00), 2 (01), 3 (10), and 4 (11). In the ideal case, each "ideal" PI code should cause a corresponding phase shift of 1 least significant bit (LSB). It is to be understood that in other embodiments, the PI code may have more possible values (e.g., a 4-bit PI code, 8-bit PI code, etc.), and is not limited to the examples used above, and the examples below. Using the example above (e.g., 4 possible codes), 1 LSB may correspond to a 90-degree shift (e.g., PI code 1 results in a 90-degree shift, PI code 2 results in a 180-degree shift, PI code 3 results in a 270-degree shift, and PI code 4 results in a 360-degree shift). However, due to INL, the PI 305 may not produce an ideal 1-LSB shift at each PI code. Thus, in various embodiments, the PI 305 may receive a PI code, and generate a phase-shifted clock signal based on the PI code. The phase of the output signal of the PI 305 may be referred to as a "PI phase." Due to INL, each PI code causes shift in the PI phase that differs from an ideal phase corresponding to the PI code (e.g., a phase shift that would be produced by an ideal PI with no INL). In various examples, the INL is expressed as the difference between the phase of the PI and an ideal PI phase, in LSB units. A time ruler circuit 310 may be employed in the INL detection circuit 300, in combination with the phase detector 315, to measure the INL.

Accordingly, in various embodiments, the time ruler circuit 310, in combination with the phase detector 315, may be configured to measure the difference in phase of the PI 305 (e.g., phase of the signal output by the PI 305, or "PI phase") at different PI codes. In various examples, the time ruler circuit 310 may include various types of tunable on-chip delay (TOD) circuits (also referred to as "adjustable delay circuits"). In some examples, the time ruler circuit 310 may include, without limitation, various types of circuits, such as a skew control block, digital-to-time converter (DTC), time-to-digital converter (TDC), or other suitable circuit configured to measure the phase of the PI 305. In some embodiments, the time ruler circuit 310 may include a coarse delay line with fine delay control. For example, the time ruler circuit 310 may include an additional PI, such as a replica PI, configured to generate the reference signal, In some examples, the replica PI may provide coarse control over the phase of the reference signal, while fine delay may be provided via a downstream adjustable-delay circuit section of the time ruler circuit 310.

In various examples, the time ruler circuit 310 may be configured to delay a reference signal (e.g., cause a phase shift) in "steps." Each step of the time ruler circuit 310 results in a delay of a given duration. In other words, each step results in an increased delay by a "step size." For example, in some embodiments, the time ruler circuit 310 may be an inverter having an output controlled by a plurality of capacitors corresponding to the number of steps of the time ruler circuit 310. The capacitors may be selectively turned on or off to adjust a delay. Accordingly, the time ruler circuit 310 may be configured to delay a reference signal, such as a clock signal, having a reference phase. In this way, the phase of the reference signal may be swept (e.g., shifted over time) by adjusting the delay via the time ruler circuit 310. The phase of the delayed clock signal is thus referred to as a delayed-reference phase.

In some examples, the delayed-reference phase may be matched to the phase of the PI 305. In some examples, the delayed-reference phase may be matched to the phase of the PI 305 at a first code and/or at a code corresponding to no phase shift. To determine when the delayed-reference phase matches the phase of the PI 305, the delay introduced to the reference signal by the time ruler circuit 310 may be swept (e.g., delay steps increased) until it is determined that a transition has occurred in the relative phase of the delayed reference signal and the phase of the PI 305, as will be described below. In this manner, a phase of the PI 305 and delayed-reference phase may be matched.

Once the phase of the PI 305 and delayed-reference phase have been matched, the phase of the PI 305 at various PI codes may subsequently be measured with the time ruler circuit 310 using a similar matching process. For example, for each PI code of the PI 305, the phase of the PI 305 may be measured by comparison with the phase of the delayed reference signal (e.g., delayed-reference phase). The time ruler circuit 310 may thus delay, in increments of steps, the reference signal until the phase of the reference signal matches the phase of the PI 305 at a respective PI code. In this way, a phase of the PI 305 may be measured (in steps of the time ruler circuit 310) at each PI code, utilizing the delayed-reference phase to compare with the phase of the PI 305.

In various embodiments, the reference signal may, for example, be generated by a replica circuit. In some examples, the replica circuit includes a replica PI configured to produce an output having a PI phase to be used as a reference phase. In some examples, the replica PI may generate the output based on a common clock signal with the PI 305. In some examples, the replica circuit may be positioned in close proximity to the PI 305 so as to experience similar environmental conditions (e.g., voltage, temperature, etc.). In other examples, the time ruler circuit 310 may include the replica PI, and the reference signal used as input to the replica PI, which may provide coarse phase control over the reference signal. The time ruler circuit 310 may then exhibit fine control over the phase of the output of the replica signal using an adjustable delay circuit (e.g., TOD), as previously described.

In various embodiments, a phase detector 315 is configured to detect a phase difference between the output of the time ruler circuit 310 and the output of the PI 305. The phase detector 315 may include, without limitation, various types of phase detector circuits, such as a D-flip flop (DFF) phase detector, or an ADC-based phase detector. In some examples, the phase detector 315 is configured to indicate a state of the phase of the PI 305 relative to the delayed-reference phase (e.g., whether the phase of the signal generated by PI 305 is ahead of or behind the phase of the reference signal delayed by the time ruler circuit 310).

In some examples, the step at which the transition occurs (e.g., from behind in phase to ahead in phase) may be used to determine the phase of the PI 305 (e.g., based on the delay of the reference signal/delayed-reference phase). For example, in some embodiments, the phase detector 315 may output a value of "0" to indicate the phase of the PI 305 is behind the delayed-reference phase (e.g., output of the time ruler circuit 310), and a value of "1" to indicate that the phase of the PI 305 is ahead of the delayed-reference phase. In yet further embodiments, a transition point may be determined in the opposite direction (e.g., when the phase detector 315 output transitions from 1 to 0), or both transitions (from 0 to 1 and 1 to 0) may be utilized. Accordingly, in operation, the time ruler circuit 310 may be used to measure a respective phase of the PI 305 at each respective PI code of the PI 305.

Accordingly, it may be determined, based on the output of the phase detector 315, between which steps of the time ruler circuit 310 the phases become matched. For example, at a first step of the time ruler circuit 310, the phase detector 315 may indicate that the output of the time ruler circuit 310 is behind in phase from the output of the PI 305. At a subsequent step of the time ruler circuit 310, the phase detector 315 may indicate that the output of the time ruler circuit 310 is ahead in phase from the output of the PI 305. Thus, in some examples, a point between delay steps may be determined as a point of measurement (e.g., to measure the phase of the PI 305) between two steps of the time ruler circuit 310. For example, in some embodiments, a fractional step (e.g., a value measured between two steps of the time ruler circuit 310) may be determined based, at least in part, on a statistical noise distribution between steps (e.g., before and after transition of the output of the phase detector 315). In some examples, the noise distribution follows a Gaussian distribution, and the fractional step determined based on the Gaussian distribution (e.g., as a mean value of the noise distribution).

In some examples, the delay of the time ruler circuit 310 may be measured in steps, or alternatively, as units of time. For example, the time ruler circuit 310 may produce a maximum delay that is divided into an n-number of steps. Thus, a delay may be expressed as the number steps. Accordingly, in some examples, the control logic 320 may be configured to determine the delay of the time ruler circuit 310 in LSB units of the PI 305, by converting from steps to LSB of the PI 305. For example, to convert the delay of the time ruler to LSB units, the control logic 320 may perform a conversion, as described in greater detail below with respect to FIG. 4.

In various embodiments, control logic 320 may include hardware, software, or a combination of hardware and software. In some examples, control logic 320 may be incorporated, at least in part, in the PI phase control circuits 125, 225 of FIGS. 1 & 2. In further examples, the control logic 320 may, at least in part, be part of a separate control subsystem and/or circuit from the PI phase control circuits 125, 225.

In some embodiments, the control logic 320 may be configured to detect INL by measuring the phase of the PI 305 at each respective PI code, as described above. The control logic 320 may, in some examples, further output a delay control signal configured to control an adjustable delay of the time ruler circuit 310. In some examples, the adjustable delay may be controlled via a control signal (e.g., "delay control") configured to activate and/or deactivate capacitors in a capacitor-controlled delay circuit.

In further embodiments, control logic 320 may be configured to convert the delay of the time ruler circuit 310 to LSB units. Based on the conversion of LSB units, the control logic 320 may further be configured to calibrate PI 305 for INL mitigation, as will be described in greater detail below with respect to FIG. 5. In some embodiments, an INL may be determined based on the measured phase of the PI 305 and an ideal phase for a corresponding PI code. The INL may be determined in LSB, for each PI code of the PI 305. The control logic 320 may thus generate a calibrated PI code based on the determined INL for each PI code. In other embodiments, INL may be measured at every m-number of PI codes, wherein m is an integer. For example, INL may be measured at every other PI code, every four PI codes, every 8 PI codes, etc.

Accordingly, in some embodiments, the control logic 320 may re-map each of a plurality of original PI codes to a respective calibrated PI code, based on the measured INL of the PI 305 for a given original PI code. In some examples, the calibrated PI code is the original PI code adjusted by the measured INL. In further examples, each of an m-number of original PI codes preceding the original PI code for which INL is measured (inclusive of the original PI code for which INL is measured) may be calibrated based on the measured original PI code. In other examples, each of an m-number of PI codes succeeding the original PI code for which INL is measured (inclusive of the original PI code for which INL is measured) may be calibrated according to the measured original PI code.

Accordingly, in one example, to produce a delay in the phase of the PI 305 for a given original PI code, the original PI code may be adjusted by the measured INL (e.g., as measured in LSB). The original PI code as adjusted may be set as the calibrated PI code (in this example, a lower PI code). Thus, the calibrated PI code may result in a phase of the PI 305 that is closest to an ideal phase for the original PI code. For original PI codes where the phase of the PI 305 is behind in phase relative to the ideal phase for the original PI, the original PI code may be adjusted by the amount (as measured in LSB) to advance the phase. Similarly, for original PI codes where the phase of the PI 305 is ahead in phase relative to the ideal phase for the original PI, the original PI code may be adjusted by the amount (as measured in LSB) to cause a delay in phase. In this example, the original PI code may be adjusted by the INL, resulting in a larger PI code. The adjusted PI code may be set as the calibrated PI code, and thus the original PI code may be mapped to the larger, calibrated PI code. Calibration may occur in this manner for each original PI code, with each original PI code mapped to a respective calibrated PI code. Thus, PI codes generated at a receiver, such as receiver system 100, or transmitter, such as transmitter system 200, may be remapped based on the INL calibration procedure above, and calibrated PI codes provided for respective PIs.

In some examples, adjustment of the original PI code by the measured INL may result in a value that is between PI codes. For example, a given PI code may need to be adjusted by a fractional LSB value. In such examples, the nearest whole PI code to the adjusted PI code may be selected to be used as the calibrated PI code. In some examples, this may lead to a situation where multiple PI codes may be mapped to the same calibrated PI code. Similarly, in some examples, calibrated PI codes may not include every PI code. For example, an original PI code 64 (e.g., 00111111) may be mapped to calibrated PI code 63 (e.g., 00111110) and an original PI code 65 (e.g., 01000000) may be mapped to calibrated PI code 65. Thus, no calibrated PI code may correspond to a PI code of 64.

In some further examples, digital-to-analog converter calibration may be used to calibrate the PI 305 for INL. In some examples, the PI may include DAC units that are segmented into groups with different code offsets. In one set of examples, each segment of DAC units may include three DAC units, each having a respective code. Each segment of DAC units may, in various examples, be controlled by a respective PI code. The output of each respective DAC unit may, in some examples, be weighted. For example, the DAC weight may be reprogrammed based on detected INL. Specifically, weighting may be adjusted to exhibit a non-linear calibration curve. In this way, in some examples, specific DAC segments may be weighted according to INL measurements at a given original PI code (or every set of m-number of PI codes as previously described).

Figure 4:
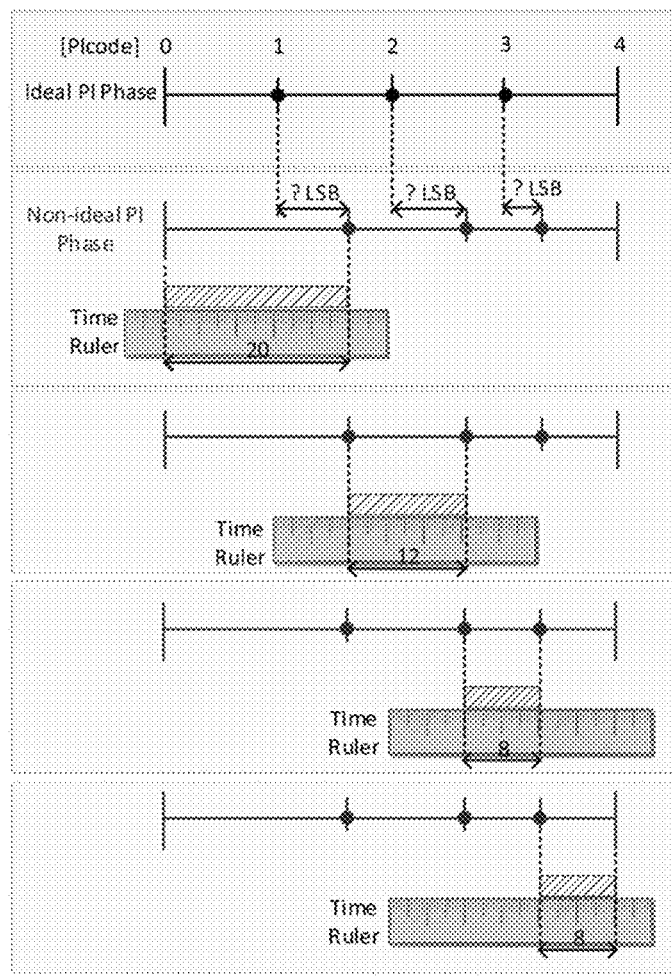
FIG. 4 is a schematic diagram illustrating a process of INL detection, in accordance with various embodiments.
Figure 4:
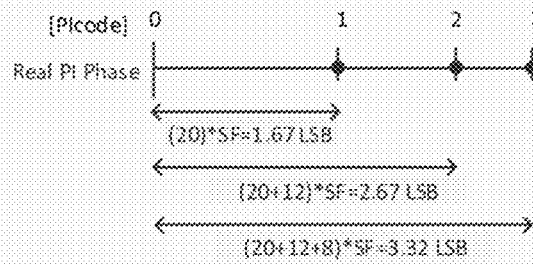
Figure 4:
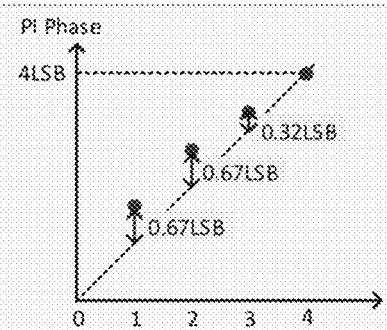

FIG. 4 is a schematic diagram illustrating a process 400 of INL detection, in accordance with various embodiments. Specifically, FIG. 4 illustrates an ideal PI phase of a signal according to an original PI code, relative to a PI phase of a signal generated by a PI, such as PI 305 of FIG. 3, for the given original PI code. In this example, a 2-bit PI code having 4 possible values is utilized (e.g., full PI rotation over four PI codes). At a PI code of 1, a signal having a first PI phase 405 is produced by the PI. A time ruler circuit may be used to measure the difference between the first PI phase 405 and the first ideal PI phase corresponding to the original PI code of 1 in terms of time ruler steps. As previously described, time ruler steps may be discrete increments of time by which a reference signal may be delayed. Accordingly, the difference in phase between the ideal PI phase and the phase of the PI may be determined based on the measured difference in steps of the time ruler. Similarly, at a PI code of 2, a second PI phase 410 may be produced. A phase difference may similarly be measured between the second PI phase 410 and second ideal PI phase corresponding to the original PI code of 2. A similar phase difference may be determined for the third PI phase 415, and fourth PI phase 420.

Specifically, to determine the phase difference, control logic, such as control logic 320, may be configured to convert the measured steps of the time ruler circuit into LSB units of the PI. In some embodiments the conversion may be determined based on a scaling factor (SF). Specifically, in some examples, SF is given by the ratio of the total number of LSBs of the PI code (e.g., 2-bit PI code has 4 total LSB, 4-bit has total of 16 LSB, and 8-bit has a total 256 LSB) over the total number of steps (e.g., delay steps) of the time ruler circuit.

$$SF = \frac{\text{Total } LSBs}{\text{Total Steps}} \qquad \text{(Eq. 1)}$$

Then, the phase difference between the PI phase of the PI and ideal PI phase may be given in LSB as the number of steps that a reference signal is delayed to match the respective PI phase of the PI, times the scaling factor, minus the number of LSBs of the PI code (e.g., PI code 1=1 LSB, PI code 2=2 LSB, so on and so forth).

$$INL_{LSB} = (SF * \text{number of steps}) - (\text{original } PI \text{ code}) \qquad \text{(Eq. 2)}$$

In some examples, as shown in FIG. 4, the reference signal may have a phase corresponding to a PI code of 0. Thus, the number of steps may effectively be measured from the phase of an unshifted signal of the PI to the respective phase of the PI at a given PI code. In the example shown, the time ruler may have a total number of steps equal to: 20+12+8+8=48 steps. The total number of LSBs of the PI code is 4 (for a 2-bit PI code). Accordingly, SF is given by: 4/48=1/12.

For the first PI phase 405, the number of steps is measured to be 20. Thus, the INL (e.g., measured phase difference from a reference "ideal" PI phase) of the PI at the first PI code (e.g., 1) may be given by (20*1/12)−1 LSB=0.67 LSB, as shown in the phase difference chart 425. For the second PI phase 410, the INL of the PI at the second PI code (e.g., 2) may be given by (32*1/12)−2 LSB=0.67 LSB. For the third PI phase 415, the INL of the PI at the third PI code (e.g., 3) may be given by (40*1/12)−3 LSB=0.32 LSB. The fourth PI phase 420 may correspond to no phase shift (or full rotation) by the PI, and thus an INL=(48*1/12)−4 LSB=0 LSB is present, as expected. In this manner, INL may be detected and measured using a time ruler circuit, and converted to LSB via control logic.

Accordingly, in some examples, to produce an ideal PI phase corresponding to an original PI code of 1, original PI code 0 produces a PI phase that is closer in phase to the ideal PI phase than the first PI phase 405. Thus, in some examples, original PI code 1 may be mapped to calibrated PI code 0. Similarly, to produce an ideal PI phase corresponding to an original PI code of 2, original PI code 1 produces a PI phase closer in phase to the ideal PI phase than the second PI phase 410. In other words, first PI phase 405 is closer in phase to the ideal PI phase for PI code 2 than the second PI phase 410. Thus, in some examples, original PI code 2 may be mapped to a calibrated PI code 1. For the third PI phase 415 corresponding to an original PI code of 3, the third PI phase 415 is closest in phase to the corresponding ideal PI phase. Thus, in some examples, the original PI code 3 may be mapped to itself (e.g., a calibrated PI code 3). For PI code 0/4, similarly no adjustment is needed and thus PI codes may be mapped to itself. This mapping is described in greater detail below with respect to FIG. 5.

Figure 5:
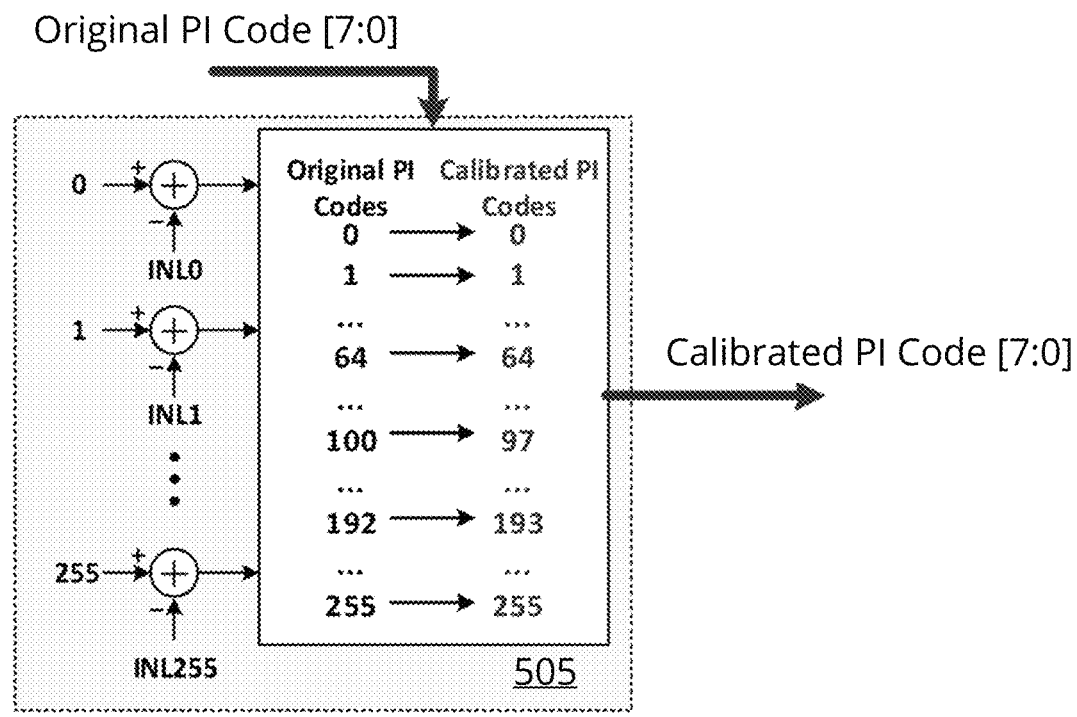
FIG. 5 is a schematic diagram illustrating a control logic implementation for INL calibration, in accordance with various embodiments.

FIG. 5 is a schematic diagram illustrating a control logic implementation 500 for INL calibration, in accordance with various embodiments. Specifically, FIG. 5 illustrates a mapping scheme 505 between an original PI code to a calibrated PI code, based on measured INL as previously described. As shown, an 8-bit PI code [7:0] is used here as an example for the purposes of illustration (though PI codes of other sizes may be used as well). As previously described, INL may be measured for a given original PI code. For an 8-bit PI code, values of the PI code may range from 0 to 255, for a total of 256 LSB. On the left side of the mapping scheme, an original PI code is provided as a first input to a digital adder/subtractor circuit. The PI code may then be adjusted, via the digital adder/subtractor circuit, by the corresponding measured INL (in LSB). In other examples, the INL may be rounded to the nearest whole LSB. In other embodiments, the sum (or difference, as the case may be) may be rounded to the nearest whole LSB. In this example, the PI code is referred to by its corresponding decimal value (e.g., PI code "0" corresponds to binary "00000000," whereas in the previous example, the 2-bit binary PI code "00" was referred to as a first PI code or PI code 1). Accordingly, in the example shown, an original PI code 0 is adjusted by a measured INL (based on the difference between phase of the PI and ideal PI phase) to determine a calibrated PI code. Thus, the calibrated PI code is the same as the original PI code. For PI code 100, however, the original PI code is adjusted by 3 LSB, and thus mapped to a calibrated PI code of 97. Original PI code 192 may, similarly, be mapped to a calibrated PI code of 193, and original PI code 255 mapped to calibrated PI code 255. In some examples, as previously described, INL may be measured every m-number of PI codes. In such examples, PI codes (100−m) through 100 are mapped to calibrated PI codes (100−m−3) through 97, respectively.

It is to be understood that in other examples, a different algorithm (e.g., mapping scheme) for mapping the original PI code to a calibrated PI code may be utilized, and that mapping is not to any single implementation. For example, in other embodiments, the mapping of original PI code to calibrated PI code may be determined according to a curve fitting function. For example, a curve or other mathematical function may be generated based on the measured INL, and calibrated PI codes determined to fit the curve. In some examples, an interpolation scheme may be applied to determine calibrated PI codes. In yet further examples, a machine learning model may be applied to determine calibrated PI codes.

In some embodiments, the mapping scheme 505 may be implemented, for example, as a mapping circuit. In some examples, the mapping circuit includes a look-up table stored in control logic, such as control logic 320 of FIG. 3. The mapping scheme 505 may be updated dynamically according to a measured INL. Thus, in some examples, the control logic includes a digital adder/subtractor circuit, as described above, configured to adjust an original PI code according to a measured INL, and output a respective calibrated PI code.

Figure 6:
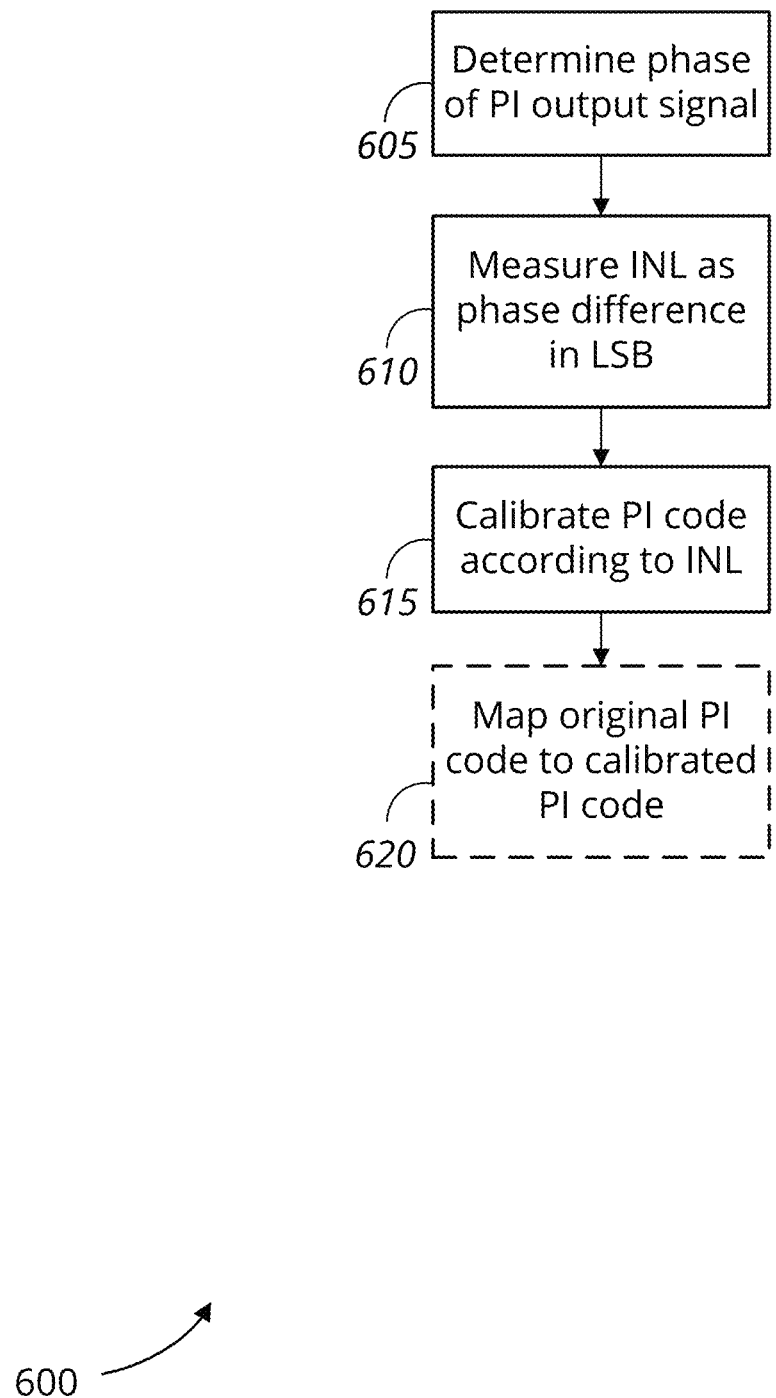
FIG. 6 is a flow diagram of a method for variation tolerant linear phase interpolation, in accordance with various embodiments.

FIG. 6 is a flow diagram of a method 600 for INL detection and calibration, in accordance with various embodiments. The method 600 may begin, at block 605, by determining a phase of a PI output signal. In various examples, a PI may generate a phase-shifted input signal (e.g., a clock signal) based on a PI code. In the case of an ideal PI, at each PI code, the phase of the input signal should be shifted by 1 LSB. The phase of the ideally shifted signal is the ideal PI phase. However, due to INL, this is not the case. Thus, the phase of the PI output signal (e.g., the phase of the PI) may be determined.

At block 610, the method 600 continues by measuring INL of the PI at the given PI code. In various examples, INL may be measured as the difference in phase between the phase of the PI at a given PI code and an ideal PI phase at the PI code. As previously described, an original PI code should produce a signal shifted by an ideal phase—e.g., 1 LSB at each PI code. As previously described, using the example of a 2-bit PI code, 1 LSB may correspond to a 90-degree shift. Accordingly, in various embodiments, INL may be measured as the difference between the phase of the PI at the PI code, and the corresponding ideal PI phase, in LSB units. As previously described, in some examples, an INL of the PI may be measured in steps of a time ruler circuit. The steps of the time ruler may then be converted into LSB units. A time ruler circuit includes, in various examples, an adjustable delay circuit. The time ruler circuit may be configured to output a reference signal that has been delayed by the duration of an adjustable delay of the time ruler circuit. In some examples, the phase of the PI at a given code may be compared against the reference signal that has been delayed (effectively shifted in phase), as previously described. In some examples, the phase of the PI and delayed-reference phase may be compared via a phase detector circuit. In some examples, the phase detector circuit outputs a signal indicative of a position of the phase of the PI relative to the delayed-reference phase.

Accordingly, in some examples, the time ruler circuit may sweep the phase of the reference signal (e.g., the phase of the reference signal is shifted over time) by adjusting the tunable delay. For example, the reference signal may be delayed incrementally (and/or decrementally) in steps, until the output of the phase detector circuit transitions, indicating that the phase of the PI and delayed-reference phase have been matched. A difference in phase from an ideal PI phase may thus be measured in steps of the time ruler circuit. In some examples, the phase difference from the idea PI phase may be determined based, at least in part, on a total number of steps of the time ruler circuit for a full rotation of the PI (e.g., using a scaling factor as previously described). Thus, a delay of the reference signal at the point where the delayed-reference phase matches the phase of the PI is measured, at each respective PI code, in steps of the time ruler circuit. The delay may then be converted to LSB units, for example, via control logic, using a scaling factor as previously described. In this way, INL may be measured for the PI in LSB. In some examples, INL may be measured for the PI at each PI code. In other examples, INL may be measured at intervals of every m-number of PI codes.

At block 615, the method 600 continues by calibrating the PI code according to the measured INL. As previously described, in some examples, each PI code may be adjusted based on the measured INL that generates a PI output signal having a phase that is closest to the ideal PI phase for a given PI code. Accordingly, in various examples, to differentiate, the PI code before calibration may be called an "original" PI code, and after calibration the "calibrated" PI code. Thus, in some examples, each original PI code may be mapped to a calibrated PI code, where the calibrated PI code causes the PI to generate an output having a phase closest to the ideal PI phase for the original PI code. In some examples, INL may be measured in LSB. Accordingly, calibrating the PI code may include adjusting each original PI code based on the measured INL in LSB, and according to a mapping scheme, as previously described. For instance, in one example, if a PI has a measured INL of 0.67 LSB for a given PI code, the original PI code may, in some examples, be reduced by 0.67 LSB. Correspondingly, if the PI has a measured INL of -0.67 LSB for a given PI code, the original PI code may be increased by 0.67 LSB.

In some further examples, calibrating the PI code includes calibrating current-controlled DACs of a PI based on INL. As previously described, the PI may include DAC units that are segmented into groups with different PI codes. In some examples, each segment of DAC may be controlled by a respective PI code. Thus, the output of each respective DAC unit may be weighted according to INL measurements at a given original PI code (or every set of m-number of PI codes as previously described), to offset the effects of the measured INL.

At block 620, the method 600 further includes mapping the original PI code to a calibrated PI code. As previously described, adjustment of the original PI code by the INL may result in a PI code that has been adjusted by a fractional LSB unit. In such examples, the original PI code may be mapped to the closest PI code as the calibrated PI code. In some examples, the each original PI code may be mapped to a respective calibrated PI code. In some examples, the mapping may be implemented via a look-up table stored in control logic. In further examples, the mapping may be implemented, at least in part, via an adder/subtractor circuit that may adjust an original PI code to produce a corresponding calibrated PI code based on the measured INL.

The techniques and processes described above with respect to various embodiments may be performed by one or more systems 100, 200 and/or subsystems and components thereof, such as the variation tolerant linear phase interpolator circuit 300 as described above with respect to FIGS. 1-3, and which may perform the methods provided by various other embodiments, as described herein.

While some features and aspects have been described with respect to the embodiments, one skilled in the art will recognize that numerous modifications are possible within the spirit and scope of the invention. For example, the methods and processes described herein may be implemented using hardware components, custom integrated circuits (ICs), programmable logic, and/or any combination thereof. Further, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. A method comprising:
   determining a first phase of an output signal of a phase interpolator, wherein the output signal is generated by the phase interpolator based on a first code;

adjusting, via an adjustable delay circuit, a delay of a reference signal having a second phase until the second phase matches the first phase, wherein the delay of the reference signal is adjustable in increments of steps;

measuring, via control logic, the delay of the reference signal when the second phase matches the first phase, wherein the delay is measured in steps;

determining integral non-linearity of the phase interpolator at the first code based, at least in part, on the delay; and calibrating, via the control logic, the first code based, at least in part, on the integral non-linearity.

2. The method of claim 1, wherein determining integral non-linearity of the phase interpolator at the first code further comprises:

converting, via the control logic, the total delay from steps to a phase difference measured in least significant bits of the first code.

3. The method of claim 1, wherein calibrating the first code further includes:

producing, via the control logic, a second code, wherein the second code is produced by adjusting the first code based on the phase difference; and mapping, via the control logic, the first code to the second code.

4. The method of claim 3, wherein the second code is a phase interpolator code nearest to an adjusted phase interpolator code, wherein the adjusted phase interpolator code is the first code adjusted based on the phase difference.

5. The method of claim 1, wherein the phase interpolator includes one or more digital-to-analog converter (DAC) units, each DAC unit corresponding to a respective code, wherein calibrating the first code further includes:

adjusting a weight of at least one DAC unit of the one or more DAC units based on the phase difference.

6. The method of claim 1, further comprising:

determining the integral non-linearity of the phase interpolator at a first interval of phase interpolator codes, wherein determining integral non-linearity of the phase interpolator at the first interval further comprises:

determining respective first phases of the output signal of the phase interpolator generated based on respective phase interpolator codes separated by the first interval;

for each respective phase interpolator code, delaying, via the adjustable delay circuit, the reference signal until respective second phases of the reference signal match corresponding respective first phases; and measuring, via the control logic, respective delays of the reference signal when respective second phases match the corresponding respective first phases.

7. The method of claim 6, further comprising:

mapping, via the control logic, each phase interpolator code of the phase interpolator to a respective calibrated phase interpolator code, based on the measured total delay.

8. The method of claim 1, further comprising:

determining, via a phase detector circuit, a state of the first phase relative to the second phase, wherein the state indicates whether the first phase is ahead of the second phase or behind the second phase;

wherein measuring the total delay further includes measuring the total delay when a transition in the state of the first phase relative to the second phase occurs, wherein the transition is a change in the state of the first phase relative to the second phase.

9. A circuit comprising:

a phase detector circuit configured to:
determine a first phase of an output signal of a phase interpolator, wherein the output signal is generated by the phase interpolator based on a first code;
determine a second phase of a reference signal;
determine a state of the first phase relative to the second phase, wherein the state indicates whether the first phase is ahead of or behind the second phase;

an adjustable delay circuit coupled to the phase detector circuit, the adjustable delay circuit configured to adjust a delay of the reference signal until the second phase matches the first phase, wherein the delay of the reference signal is adjustable in increments of steps;

control logic coupled to the phase detector circuit and the adjustable delay circuit, the control logic configured to:
measure a total delay of the reference signal when the second phase matches the first phase, wherein the total delay is measured in steps;
determine integral non-linearity of the phase interpolator at the first code based on the total delay; and
calibrate the first code based, at least in part, on the integral non-linearity.

10. The circuit of claim 9, wherein the control logic is further configured to convert the total delay from steps to a phase difference measured in least significant bits of the first code, wherein the integral non-linearity of the phase interpolator is determined based on the phase difference.

11. The circuit of claim 9, wherein calibrating the first code further includes producing a second code, wherein the second code is produced by adjusting the first code based on the phase difference, wherein the control logic is further configured to map the first code to the second code.

12. The circuit of claim 11, wherein the second code is a phase interpolator code nearest to an adjusted phase interpolator code, wherein the adjusted phase interpolator code is the first code adjusted based on the phase difference.

13. The circuit of claim 9, wherein the control logic is further configured to adjust a weight of at least one digital-to-analog (DAC) unit of the phase interpolator based on the phase difference, wherein the phase interpolator includes one or more DAC units, each DAC unit corresponding to a respective code.

14. The circuit of claim 9, wherein measuring the total delay further includes measuring the total delay when a transition in the state of the first phase relative to the second phase occurs, wherein the transition is a change in the state of the first phase relative to the second phase.

15. An apparatus comprising:

control logic coupled to a phase detector circuit and an adjustable delay circuit, the control logic configured to:
obtain, via the phase detector circuit, a state of a first phase of an output signal of a phase interpolator relative to a second phase of a reference signal, wherein the state indicates whether the first phase is ahead of or behind the second phase, wherein the output signal is generated by a phase interpolator based on a first code;
adjust, via the adjustable delay circuit, a delay of the reference signal until the second phase matches the first phase, wherein the delay of the reference signal is adjustable in increments of steps;
measure a total delay of the reference signal when the second phase matches the first phase, wherein the total delay is measured in steps;
determine integral non-linearity of the phase interpolator at the first code based on the total delay; and calibrate the first code based, at least in part, on the integral non-linearity.

16. The system of claim 15, wherein the control logic is further configured to convert the total delay from steps to a phase difference measured in least significant bits of the first code, wherein the integral non-linearity of the phase interpolator is determined based on the phase difference.

17. The system of claim 15, wherein calibrating the first code further includes producing a second code, wherein the second code is produced by adjusting the first code based on the phase difference, wherein the control logic is further configured to map the first code to the second code.

18. The system of claim 17, wherein the second code is a phase interpolator code nearest to an adjusted phase interpolator code, wherein the adjusted phase interpolator code is the first code adjusted based on the phase difference.

19. The system of claim 15, wherein the control logic is further configured to adjust a weight of at least one digital-to-analog (DAC) unit of the phase interpolator based on the phase difference, wherein the phase interpolator includes one or more DAC units, each DAC unit corresponding to a respective code.

20. The system of claim 15, wherein measuring the total delay further includes measuring the total delay when a transition in the state of the first phase relative to the second phase occurs, wherein the transition is a change in the state of the first phase relative to the second phase.

* * * * *